United States Patent [19]

Nagano et al.

[11] Patent Number: 5,795,794

[45] Date of Patent: Aug. 18, 1998

[54] METHOD FOR FORMING A SEMICONDUCTOR DEVICE HAVING A CAPACITOR

[75] Inventors: Yoshihisa Nagano; Eiji Fujii, both of Osaka; Toru Nasu, Kyoto; Akihiro Matsuda, Osaka, all of Japan

[73] Assignee: Matsushita Electronics Corporation, Osaka, Japan

[21] Appl. No.: 678,291

[22] Filed: Jul. 11, 1996

[30] Foreign Application Priority Data

Jul. 14, 1995 [JP] Japan ................... 7-178523

[51] Int. Cl.⁶ .................... H01L 21/70; H01L 27/00
[52] U.S. Cl. .................... 437/60; 437/52; 437/919
[58] Field of Search ................ 437/52, 60, 919, 437/47

[56] References Cited

U.S. PATENT DOCUMENTS

| | | | |
|---|---|---|---|
| 5,081,559 | 1/1992 | Fazan et al. | 361/313 |
| 5,364,811 | 11/1994 | Ajika et al. | 437/52 |
| 5,403,766 | 4/1995 | Miyake | 437/52 |

FOREIGN PATENT DOCUMENTS

| | | |
|---|---|---|
| 2-1154 | 1/1990 | Japan . |
| 6-119812 | 4/1994 | Japan . |

*Primary Examiner*—Jey Tsai
*Attorney, Agent, or Firm*—McDermott, Will & Emery

[57] ABSTRACT

The present invention relates to method of manufacturing semiconductor devices having built-in capacitor comprising a dielectric substance of high dielectric constant or a ferroelectric substance as the capacitance insulation film, and aims to solve a problem that the prior art capacitance insulation film contained in semiconductor devices has a rough surface which results in a poor insulating voltage and a large spread in electrical characteristics, as well as broken connection wire; in which method a capacitance insulation film is produced by first forming a first dielectric film, and forming a second dielectric film on the first dielectric film for a thickness greater than the difference in level between top and bottom of the surface of first dielectric film, and forming a thin film whose etching speed is identical with that of the second dielectric film on the second dielectric film making the surface of thin film flat, and then etching the whole of the thin film and part of the second dielectric film off simultaneously to make the surface of second dielectric film flat.

5 Claims, 3 Drawing Sheets

METHOD FOR FORMING A SEMICONDUCTOR DEVICE HAVING A CAPACITOR

FIELD OF THE INVENTION

The present invention relates to a manufacturing method of semiconductor devices having built-in capacitance element comprising a dielectric substance of high dielectric constant or a ferroelectric substance as the capacitance insulation film.

BACKGROUND OF THE INVENTION

Under a general technological environment aiming for the higher speed in information processing by microcomputers, and the lower power consumption in electronic appliances, functions of consumer electronic appliances have been making a remarkable progress. This expedites the scale reduction of semiconductor devices, as well as their wiring pattern, to be incorporated in such appliances. As a result, the unnecessary radiation from electronic appliances causing an electromagnetic wave noise has emerged. The technology of forming a large capacitance capacitor with a dielectic substance having large dielectric constant (hereinafter referred to as high dielectric) as capacitance insulation film to be built in a semiconductor integrated circuit has been attracting an attention to reduce the unnecessary radiation. Also, along with the trends for higher integration density in dynamic RAM, studies are extensively conducted on technologies to use a high dielectric as the capacitance inslulation film in place of conventional silicon oxide or silicon nitride. Further, in order to implement a non-volatile RAM of low operating voltage and high read/write speed, R&D activities are being carried out with focus on a ferroelectric film having spontaneous polarization characteristic.

In the following, a conventional manufacturing method of semiconductor devices is described referring to drawings.

FIG. 3(a) through (f) are cross sectional views of a semiconductor device showing steps of a conventional manufacturing method; where, numeral 1 denotes an inter layer insulation film covering the surface of a substrate on which semiconductor integrated circuits are formed, 2 a bottom electrode of capacitor, 3 a capacitance insulation film comprised of a high dielectric or ferroelectric substance (hereinafter referred to as dielectric), 4 a top electrode of capacitor, 5 a passivation film for capacitor, and 6 a metal wiring.

In the first place, bottom electrode of capacitor 2 is formed on inter layer insulation film 1 covering the surface of a substrate on which semiconductor integrated circuits are formed, as shown in FIG. 3(a). Next, as shown in FIG. 3(b), a dielectric film which makes itself the capacitance insulation film 3 is formed on bottom electrode of capacitor 2, then sintered in an oxygen-containing atmosphere to have the dielectric crystalized, as shown in FIG. 3(c); when, the diameter of crystal grain is approximately 100 nm. Next, as shown in FIG. 3(d), top electrode of capacitor 4 is formed on the crystalized capacitance insulation film 3. Top electrode of capacitor 4 and capacitance insulation film 3 are selectively etched using a same mask, and then bottom electrode of capacitor 2 is selectively etched, as shown in FIG. 3(e). Then, as shown in FIG. 3(f), after covering the entire surface with passivation film for capacitor 5, a through hole reaching bottom electrode of capacitor 2 and a through hole reaching top electrode of capacitor 4 are provided in passivation film for capacitor 5. Metal wiring 6 is provided to each of the through holes, thus a capacitor is shaped.

In order to have capacitance insulation film 3 to function as high dielectric having sufficiently high dielectric constant, or to secure a sufficient remanent polarization quantity as ferroelectric substance, crystal grains having approximately 100 nm diameter at the smallest need to be provided. In the conventional manufacturing method as described above, however, the size of crystal grain, which needs to be grown to be at least approximately 100 nm diameter if the capacitance insulation film 3 has to provide a sufficiently high dielectric constant as high dielectric substance or a sufficient remanent polarization quantity as ferroelectric substance, is too large relative to the thickness required to capacitance insulation film 3, average thickness of which being approximately 200 nm; consequently, the surface condition of ferroelectric film turns out to be very rough. If such a ferroelectric film is used for making a capacitor, problems arise; for example, breakdown voltage going low, electrical characteristics such as dielectric constant, remanent polarization quantity, etc. fluctuating, metal wirings formed on capacitance insulation film 3 easily broken. These lead to a deteriorated reliability of semiconductor devices themselves containing such capacitors.

SUMMARY OF THE INVENTION

The present invention intends to present a manufacturing method of semiconductor devices through which method a semiconductor device containing a capacitor of excellent electrical characteristics, and breakage of metal wiring on capacitor is prevented, is produced through flattening of the surface of capacitance insulation film.

In the present invention, on the surface of a first dielectric film formed ealier a second dielectric film is formed for a thickness greater than the difference in level between the top and bottom (extrusion and depression) of rough surface of the first dielectric film; further on the second dielectric film a thin film whose etching speed is identical with that of the second dielectric film is formed so that the surface of thin film becomes flat; and then the whole of the thin film and part of the second dielectric film are etched off at a same time, to obtain a capacitance insulation film comprised of flat-surfaced second dielectric film.

A dielectric substance of high dielectric constant or a ferroelectric substance is used as the first dielectric film, the second dielectric film or the thin film; and for the etching, a dry etching process with halogen gas or wet etching process with acidic liquid is employed.

According to the present invention, a thin film whose etching speed is identical with that of a second dielectric film is formed on the second dielectric film, and the whole of the thin film and part of the second dielectric film are etched off at a same time, and the surface of a capacitance insulation film comprised of the first dielectric film and the second dielectric film is made to be flat. Therefore, the breakdown voltage of a capacitor may be raised, the fluctuation of electrical characteristics such as dielectric constant, quantity of remanent polarization, etc. may be suppressed. Further, because possible breakage of wiring on capacitor is prevented, the present invention makes a contribution in manufacturing semiconductor devices of high reliability.

DESCRIPTION OF PREFERRED EMBODIMENTS

An embodiment of the present invention is described with reference to FIG. 1 and FIG. 2, where the constituent parts having the same function as those of a prior art semiconductor device shown in FIG. 3 are given with the same numerals.

Figure 3A:
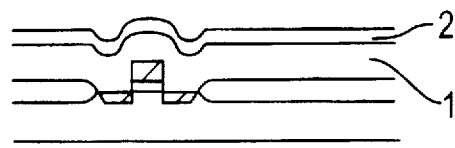
FIG. 3(a)–(f) are cross sectional views of a semiconductor device showing a prior art manufacturing method.
Figure 3B:
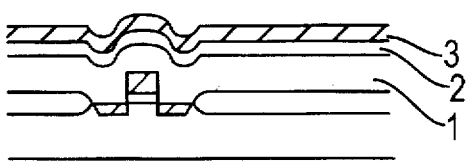
Figure 3C:
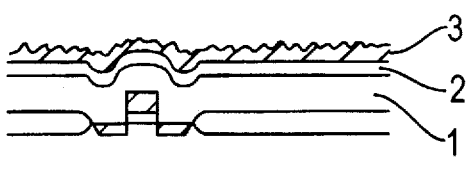
Figure 3D:
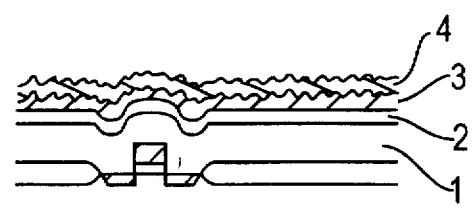
Figure 3E:
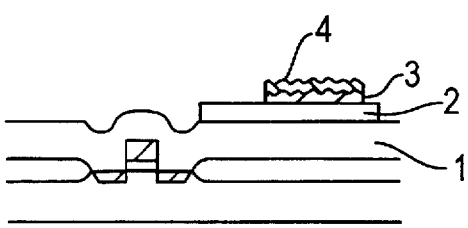
Figure 3F:
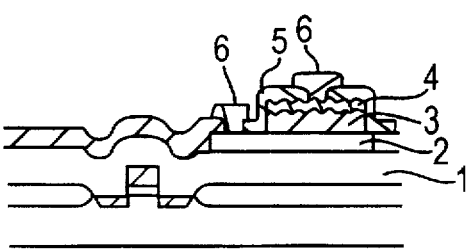

FIG. 1(a)–(d) are cross sectional views of a semiconductor device showing the second half process steps of a manufacturing method according to an embodiment of the present invention; where, the process steps upto formation of bottom electrode of capacitor 2 on the surface of inter layer insulation film 1 covering the surface of a substrate on which semiconductor integrated circuits are formed, and formation of a first dielectric film 7 remain the same as those of prior art process as shown in FIG. 3(a).

In FIG. 1, numeral 8 denotes a second dielectric film comprised of, like a first dielectric film 3, a high dielectric substance or a ferroelectric substance, and having a film thickness greater than the difference in level of top and bottom of the rough surface of the first dielectric film 7; 9 a thin film comprised of a substance whose etching speed is identical with that of the second dielectric film 8; and 10 a capacitance insulation film whose surface is fully flattened by the etching-off of the whole thin film 9 and part of the peaks of the second dielectric film 8, and integrated as one body with the first dielectric film 7.

Figure 1A:
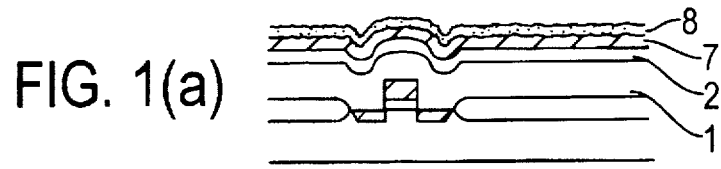
FIG. 1(a)–(f) are cross sectional views of a semiconductor device showing a manufacturing method according to an embodiment of the present invention.

In the following, the manufacturing method is described more in detail. Firstly, as described above, a bottom electrode of capacitor 2 is formed on an inter layer insulation film 1 covering the surface of a substrate on which semiconductor integrated circuits are formed, and a first dielectric film 7 is formed and sintered at approximately 600–800° C. in an oxygen-containing atmosphere for crystallization, in the same way as the conventional method. Then, as shown in FIG. 1(a), a second dielectric film 8 is formed using the same dielectric substance as the first dielectric film 7 for a thickness greater than the difference in level of top and bottom of rough surface of the first dielectric film 7, and sintered, like the first dielectric film 7, in an oxygen-containing atmosphere at a temperature approximately 600–800° C. but lower than the temperature at which the first dielectric film 7 was sintered, for crystallization.

Figure 1B:
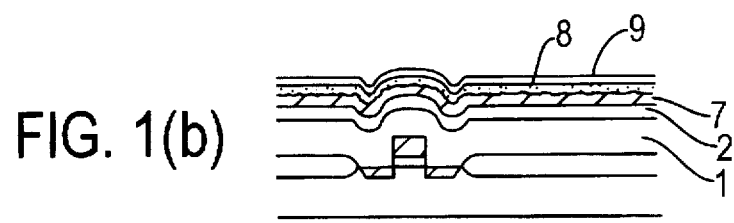

Assuming the average film thickness of the first dielectric film 7 after crystallization to be 200 nm, the difference in level of top and bottom on the surface will be approximately 100 nm, taking the dielectric crystal grain size of approximately 100 nm into consideration. Next, as shown in FIG. 1(b), a thin film 9 whose etching speed is identical with that of the second dielectric film 8 is formed on the second dielectric film 8. In the present embodiment, a material comprised of a high dielectric or a ferroelectric is used for thin film 9. However, any other material may be used in so far as it has an etching speed identical with that of the second dielectric film 8.

Figure 1C:
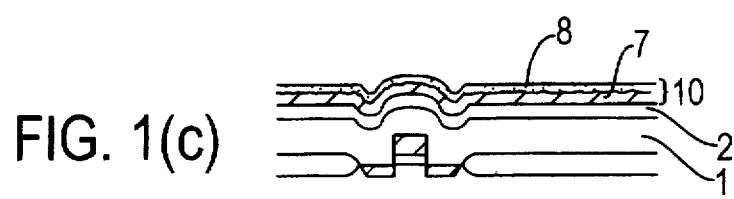

Thin film 9 fills in the unevenness of surface of dielectric film 8, and does not need to have heat treatment, therefore the surface is quite flat. The whole of thin film 9 and the peak parts of the second dielectric film 8 are etched off at a same time in halogen gas, as shown in FIG. 1(c). As thin film 9 and second dielectric film 8 are etched at a same speed, the etching action proceeds maintaining the surface flatness of thin film 9 even when etching surface reaches a level where the peak part of second dielectric film 8 and the thin film 9 filling the valley of second dielectric film 8 coexist on a plane; by further advancing the etching work until the peak part of first dielectric film 7 is exposed, a capacitance insulation film 10 having a flat surface plane comprised of the peak part of first dielectric film 7 and the second dielectric film 8 filling the valley of first dielectric film 7 coexist on a same plane is obtained.

Figure 1D:
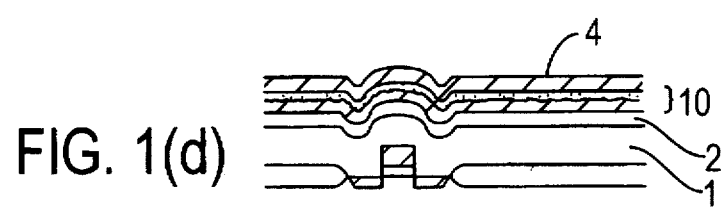
Figure 1E:
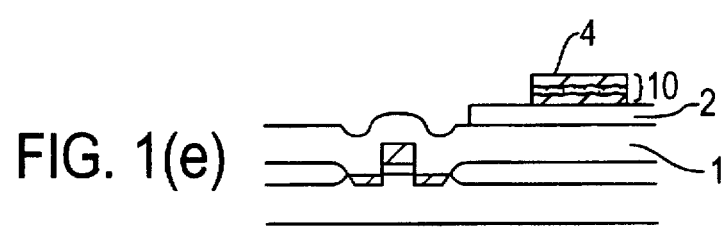
Figure 1F:
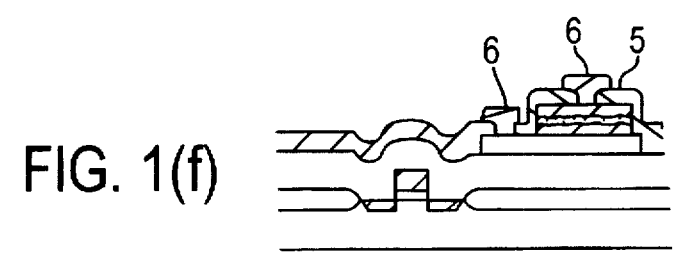

Next, as shown in FIG. 1(d), top electrode of capacitor 4 is formed on the flat surface of capacitance insulation film 10. And then, as shown in FIG. 1(e), top electrode of capacitor 4 and capacitance insulation film 10 are selectively etched with a same mask, and bottom electrode of capacitor 2 is selectively etched. As shown in FIG. 1(f), a passivation film for capacitor 5 is formed to cover the whole surface, and a through hole reaching bottom electrode of capacitor 2 and a through hole reaching top electrode of capacitor 4 are provided in the passivation film for capacitor 5. By providing a metal wiring 6 in the respective through holes, a capacitor comprising capacitance insulation film 10 having flat surface, comprised of first dielectric film 7 and second dielectric film 8, is obtained.

Figure 2:
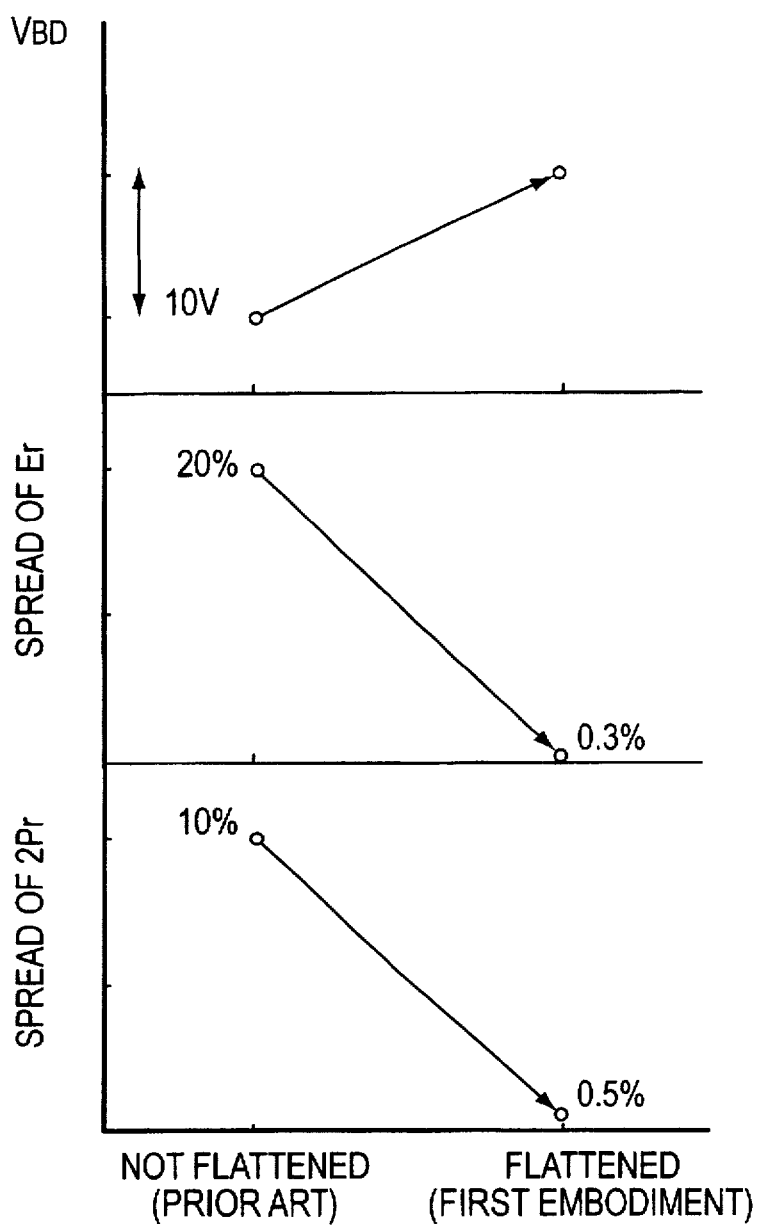
FIG. 2 compares electrical characteristics of semiconductor devices according to the present embodiment versus prior art.

FIG. 2 compares electrical characteristics of a capacitor according to the present embodiment and those of a prior art capacitor; which clarifies that the breakdown voltage($V_{BD}$) of a capacitor according to the present embodiment has been raised by approximately 10 V versus prior art capacitor, that the fluctuation of specific inductive capacity($\epsilon r$) has been improved to within 0.3%, and that the fluctuation of rmanent polarization quantity(Pr) has been improved to within 0.5%. Further, as the surface has been flattened cutting the unevenness away, the possible breakage of matal wiring 6 formed on capacitor is avoidable. Thus, a semiconductor manufacturing method according to the present invention makes it possible to produce semiconductor devices having an excellent reliability.

The reason why in the present embodiment the capacitance insulation film 10 is comprised of a first dielectric film 7 and a second dielectric film 8 both made from high dielectric substance or ferroelectric substance is to reduce the top/bottom level difference to a minimum by suppressing the growth of crystal grain in second dielectric film 8. Therefore, if by some means the growth of crystal during crystallization process of dielectric at a specified sintering temperature is successfully curtailed to suppress the unevenness of surface to the lowest possible, then the thin film 9 may be formed on first dielectric film 7; namely, a manufacturing through one-time formation of dielectric film is possible.

Although etching process in the present embodiment has been described with respect to a dry etching using halogen gas, it is of course possible to produce the same results through a wet etching using acidic liquid.

We claim:

1. A method of manufacturing semiconductor devices incorporating a built-in capacitor using dielectric substance as capacitance insulation film; wherein said capacitance insulation film is formed by first forming a first dielectric film, and forming a second dielectric film on the surface of said first dielectric film for a thickness greater than the difference in level between extrusion and depression spot on the surface of the first dielectric film, and forming a thin film whose etching speed is identical with that of the second dielectric film on the surface of said second dielectric film making the surface of thin film flat, and then etching the whole of said thin film and part of said second dielectric film off simultaneously to make the surface of second dielectric film flat.

2. The semiconductor device manufacturing method of claim 1, wherein either the first dielectric film or the second dielectric film is comprised of a dielectric substance having high dielectric constant or a ferroelectric substance.

3. The semiconductor device manufacturing method of claim 1 or claim 2, wherein the thin film is comprised of a dielectric substance having high dielectric constant or a ferroelectric substance.

4. The semiconductor device manufacturing method of claim 1, wherein the etching is conducted by dry etching process using halogen gas.

5. The semiconductor device manufacturing method of claim 1, wherein the etching is conducted by wet etching process using acidic liquid.

* * * * *